United States Patent [19]

Meitner

[11] Patent Number: 5,598,423

[45] Date of Patent: *Jan. 28, 1997

[54] VERY LOW JITTER CLOCK RECOVERY FROM SERIAL AUDIO DATA

[76] Inventor: Edmund Meitner, 4637 Mac Leod Tr. S.W., Calgary/Alberta, Canada

[ * ] Notice: The term of this patent shall not extend beyond the expiration date of Pat. No. 5,404,362.

[21] Appl. No.: 367,833

[22] Filed: Jan. 3, 1995

Related U.S. Application Data

[63] Continuation of Ser. No. 802,332, Dec. 4, 1991, Pat. No. 5,404,362.

[51] Int. Cl.⁶ .................................................. G06F 11/00
[52] U.S. Cl. ................................. 371/47.1; 375/364
[58] Field of Search ............................ 371/47.1, 42, 46; 375/111, 118, 113, 364, 354, 355, 371

[56] References Cited

U.S. PATENT DOCUMENTS

| | | | |
|---|---|---|---|
| 4,644,546 | 2/1987 | Doi et al. ............................. | 371/49 |
| 4,754,457 | 6/1988 | Bright et al. ......................... | 371/47.1 |
| 4,847,876 | 7/1989 | Baumbach et al. ................... | 375/113 |
| 4,887,269 | 12/1989 | Cominetti ............................ | 371/47.1 |
| 5,012,491 | 4/1991 | Iwaski ................................. | 375/96 |
| 5,038,351 | 8/1991 | Sakei et al. .......................... | 371/47.1 |
| 5,101,394 | 3/1992 | Endoh ................................. | 369/59 |
| 5,111,482 | 5/1992 | Ohtake ................................ | 375/90 |
| 5,185,740 | 2/1993 | Kurose et al. ....................... | 370/106 |
| 5,373,513 | 12/1994 | Howe et al. ......................... | 371/47.1 |
| 5,404,362 | 4/1995 | Meitner ............................... | 371/47.1 |

Primary Examiner—Robert W. Beausoliel, Jr.
Assistant Examiner—Joseph E. Palys
Attorney, Agent, or Firm—Paul F. Schenck Patent Agent

[57] ABSTRACT

Synchronization with a signal derived from code violations in periodic data block preambles, and derived using analog circuits provides for a very low jitter clock. The method involves detecting the amplitude of an analog signal derived from the preamble. The amplitude exceeds a preset value whenever a code violation is detected. The frequency of the preamble may be a fraction or a multiple of the synchronized clock.

7 Claims, 3 Drawing Sheets

VERY LOW JITTER CLOCK RECOVERY FROM SERIAL AUDIO DATA

This is a continuation of application Ser. No. 07/802,332 filed on 12/04/91, now U.S. Pat. No. 5,404,362.

BACKGROUND OF THE INVENTION

A novel clock-recovery method with superior performance has been developed for the reception of AES/EBU-EIAJ formatted serial digital audio data.

Current practices are exemplified in integrated circuits available from several manufacturers. For clock recovery, these devices all employ classical PLL methods using data edge-triggered digital phase detectors servoing voltage controlled oscillators of a convenient frequency with loop time constants determined by external RC networks. Typical examples for commercially available circuits using such clock recovery methods are YAMAHA YM3623B/3436B, PHILIPS SAA7274, CRYSTAL SEMICONDUCTOR CS8411/8412, and MOTOROLA DSP56401.

These commercially available circuits are used in audio data receivers. In prior art audio data receivers the recovered clock is corrupted by jitter (time displacement) resulting from the use of clock generating data signals.

More sophisticated designs have been used which supplement the internal phase-locked-loop amplifiers of these integrated circuits with external phase-locked-loop amplifiers, providing better performance at fs, the sampling frequency. However, even these more sophisticated designs are subject to data-induced jitter at any of their regenerated clocks.

SHORT DESCRIPTION OF THE INVENTION

A new clock-recovery scheme has been developed and tested which exhibits no sensitivity to input data variations so that clocks with stabilities exceeding the requirements of digital audio systems can be implemented.

Rather than relying on data stream triggered bit-clock recovery, the circuit of the present invention utilizes instead the timing of the preambles within the data and directly synchronizes a clock circuit to this stable occurrence (e.g. 88.2 Khz at a sample frequency of 44.1 KHz), thus generating all required system clock rates with no data dependent jitter. This preamble detection is performed in the analog domain and it is possible because the preambles produce DC variations in the NRZ serial data. A schematic diagram of one embodiment of this clock recovery method is provided.

It is another object of the invention to provide means for a self clocking signal receiver to recover a clock for controlling processing of the digital audio signal. Contrary to conventional arrangements which use the data stream signals for clock generation, the present invention derives the clock from the is occurrence of the preamble, which has no inherent data related variations.

Applications benefiting from the performance of this circuit include digital audio data receivers in digital audio systems, plus the ability of stand-alone in-line jitter removal from any audio data channel and stand-alone clock generator to be interfaced with existing AES/EBU receivers.

Furthermore, the present invention can be used for clock recovery in serial digital data communication applications.

DESCRIPTION OF THE PREFERRED EMBODIMENT

In the AES/EBU data format for digital audio signals, the block preamble includes a code violation for identification, which is detectable. The signal identifying the detected preamble is used to control a phase-locked-loop oscillator. The output of the oscillator is divided to produce a frequency in the frequency range of the occurrence of the preamble and controls the generated clock frequency.

The violation of the coding scheme in the preamble of a block of digital audio signals is given by the extended length of a digital signal beyond a predetermined signal duration. The integral of such a digital signal will result in an analog signal being higher in amplitude than all other signals within the same block. In the present invention the high amplitude analog signal is detected and used to correct the output of a voltage controlled oscillator (VCO).

Figure 1:
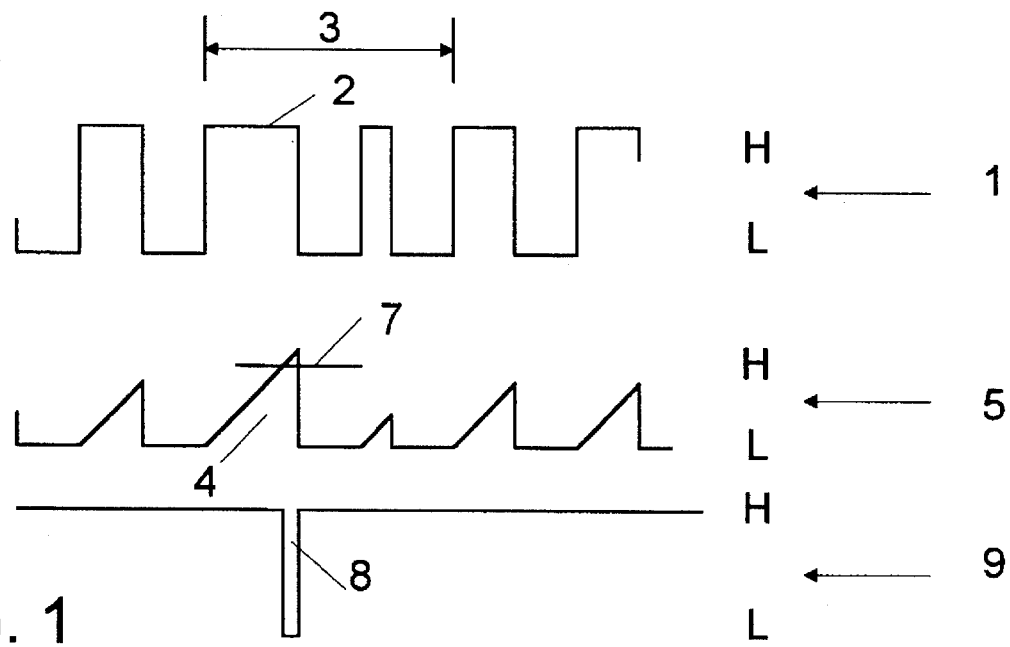
FIG. 1 is an illustration of the principle waveforms in the generation of the system clock from the preamble of a digital audio signal.

FIG. 1 is an illustration of the principle waveforms in the generation of the system clock. Waveform 1 is a digital audio signal including the violating signal 2 of a preamble 3. Signal 2 is significantly longer than all other signals within a block of signals and the remainder of the preamble 3. Integration of signal 2 results in a signal 4 as illustrated by waveform 5. Detecting the integrated signal 4 exceeding a predetermined level 7 results in a single short signal 8 coinciding with the code violating signal of the preamble, waveform 9. The output of a voltage controlled oscillator divided by a suitable value is compared with waveform 9 and causes generation of a frequency correcting voltage which is supplied to the input of voltage controlled oscillator. Depending on the signal source the signal may be provided with opposite polarity.

Figure 3:
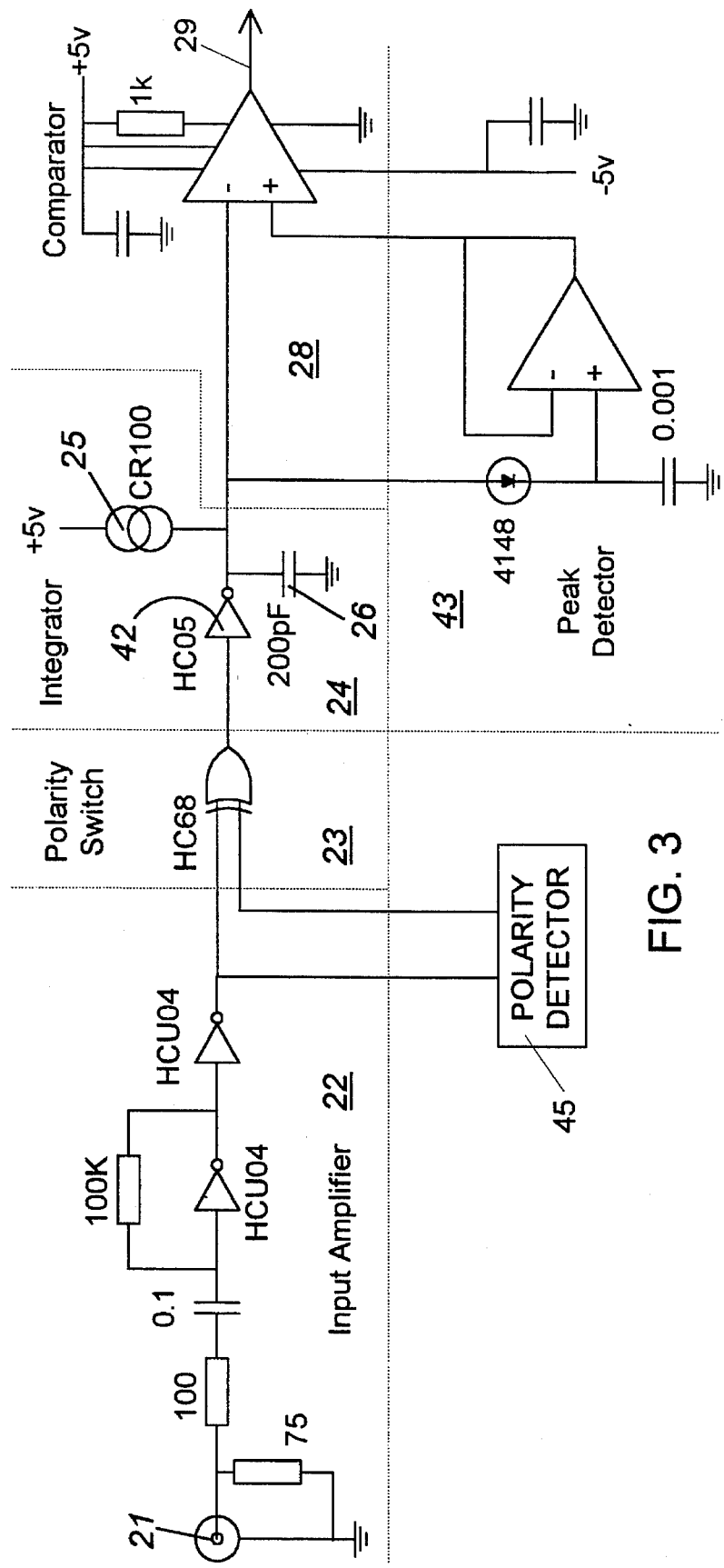
FIG. 3 is a detailed circuit diagram of the present invention.
Figure 2:
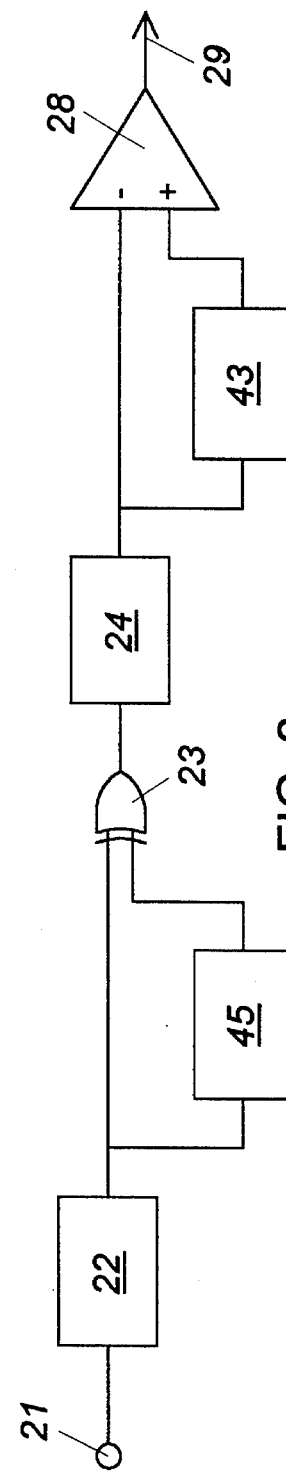
FIG. 2 is a schematic block diagram of the present invention.

FIG. 2 is a schematic block diagram of an embodiment of the present invention. FIG. 3 is a more detailed schematic illustration of the circuit of the present invention. The incoming digital audio signal (waveform 1 of FIG. 1) on input 21 is amplified in amplifier 22 to a level suitable for processing using a selected family of digital components, such as inverters of the type HCUO4. The resulting signal is fed into a polarity switch 23. Switch 23 receives a control signal on line 44 from polarity detector 45. This is to ensure that a signal of correct polarity is supplied to the integrator 24 independent of the polarity of the AES/EBU signal at input 21. The output of polarity switch 23 is fed to integrator 24 using constant current source 25 and capacitor 26. The integrated signal (signal 5 in FIG. 1) is fed to bias generator 27 which is essentially a peak detector. The integrated signal minus the offset voltage provided by bias generator 43 are fed to the inputs of a comparator 28. Comparator 28 generates an output signal (signal 8, waveform 9 in FIG. 1) on signal line 29 whenever a code violating preamble signal has been detected.

In FIG. 2 integrator 24 uses a fixed current source 25, a fixed capacitance 26, and a driver 42. In arrangements with data signals of different frequencies an integrator with automatic gain control can be used in place of integrator 24 shown in FIGS. 2 and 3.

In arrangements with fixed polarity of the data signals polarity detector 45 and switch 23 may be omitted.

Figure 4:
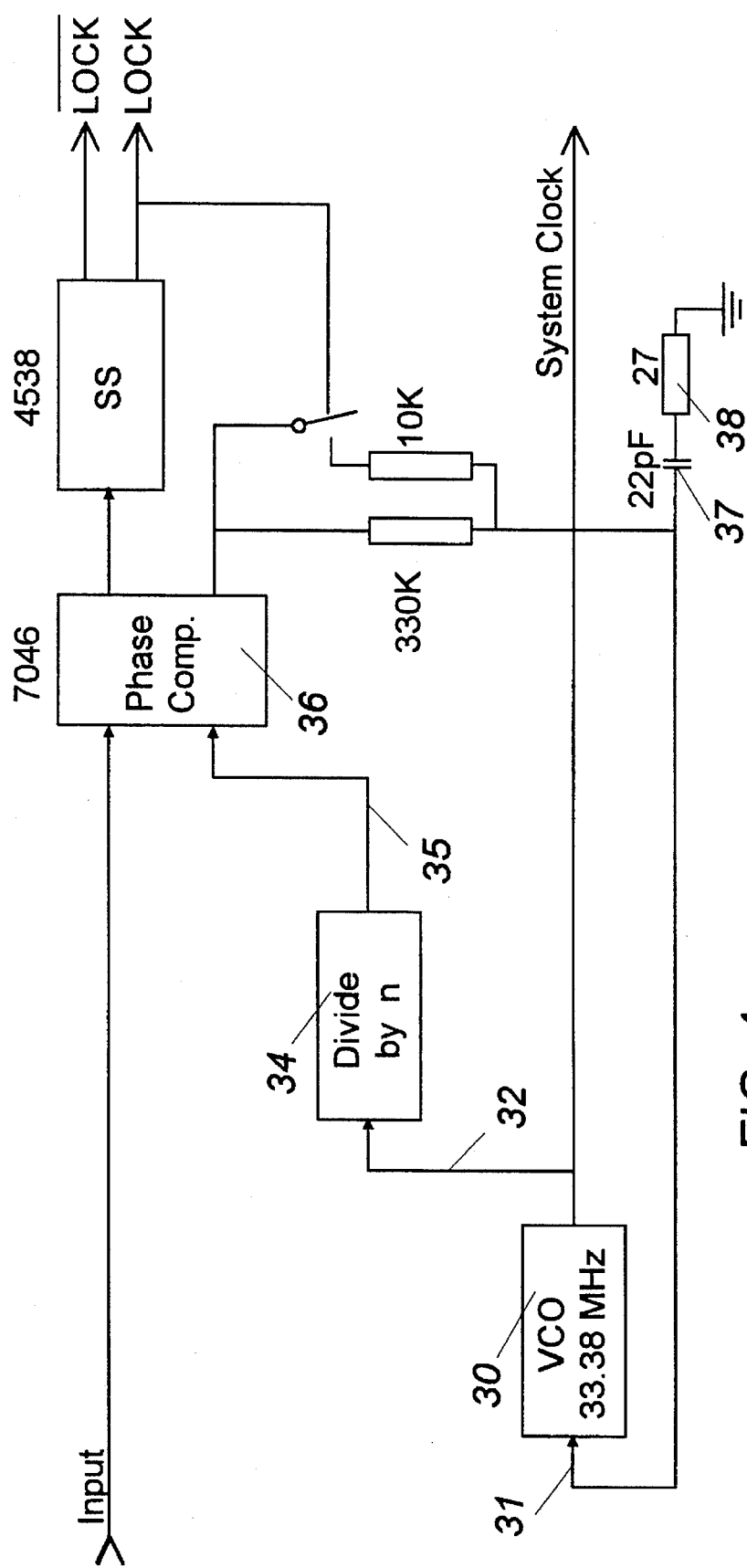
FIG. 4 s a schematic block diagram of the PLL oscillator.

FIG. 4 is a schematic block diagram of the PLL oscillator of the present invention. Voltage controlled oscillator 30 is of conventional design and provides a frequency signal on output line 32 with a frequency depending on the voltage on control input line 31. The signal on output line 32 can be used directly or indirectly as system clock of the audio system. The signal on line 32 is also fed to divider 34 which will generate an output signal on line 35 which is of the same frequency and phase as the occurrence of the code violation in the preamble of the digital audio signal. A deviation between both frequencies and phase will result in an error signal in form of a series of pulses at the output of detector 36. The error signal is filtered by the PLL loop filter consisting of capacitance 37 and resistor 38 and fed to voltage controlled oscillator 30 to correct the frequency and phase of the oscillator and thus locks the PLL.

Figure 5:
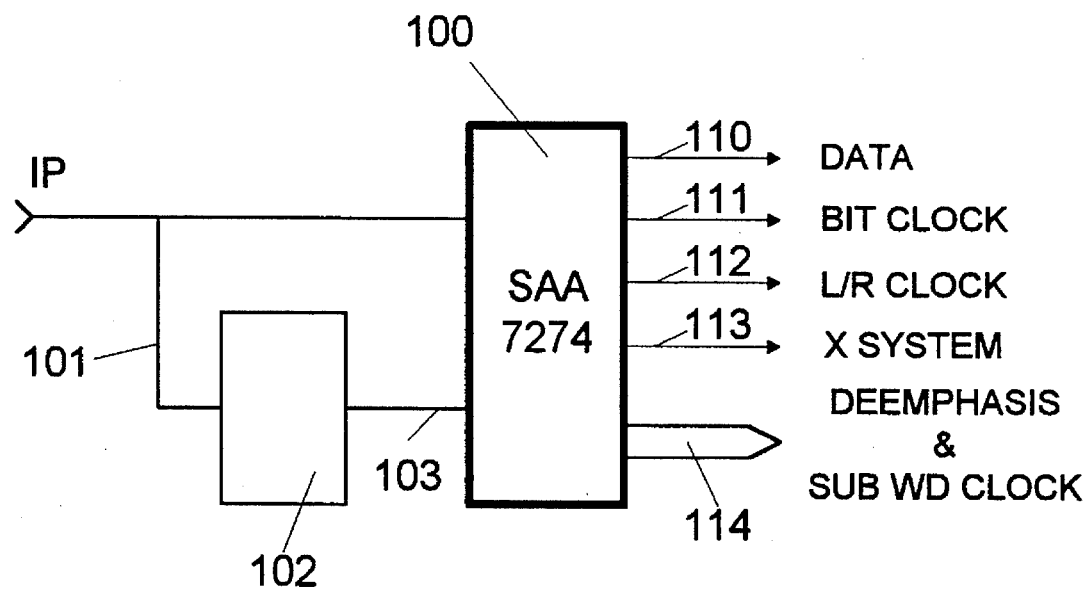
FIG. 5 is an illustration of how to use the present invention in combination with one of the commercially available circuits.

FIG. 5 is a schematic illustration of a combination of the circuit of the present invention 102 and a commercially available integrated decoder circuit 100 of the type SAA7274. Receiver circuit 100 receives digital audio signals at input 101. The same signal is fed to clock recovery circuit 102. The output of clock recovery circuit 102 is fed to input 103 of receiver circuit 100. Receiver circuit 100 provides the signals data 110, bit clock 111, L/R clock 112, X-system clock 113, and all sub-code signals 114 at a very low jitter compared with systems recovering the clock from digital data information, the known art.

The preferred embodiment described in detail is but one implementation of the present invention and many variations of the arrangement can be implemented by the artisan skilled in the art without deviating from the spirit of the present invention, such as reclocking AES/EBU data without decoding the same, supplying the clock to existing receiver circuits for AES/EBU signals.

What I claim is:

1. An arrangement for generating a clock for processing digital audio signals in a digital audio system receiving digital signals representing audio information in a predetermined code, wherein said digital information includes data information subdivided in blocks of data including block identifying preamble information, said preamble information including a signal violating said predetermined code, comprising means for generating an unipolar pulse sequence representing said digital signal; and analog circuit means for detecting said code violating signal in said unipolar pulse sequence and outputting a preamble repetition frequency signal.

2. An arrangement as claimed in claim 1 wherein said digital audio system includes data recovery means, and said clock is used to resynchronize said data.

3. An arrangement as claimed in claim 2 wherein said analog circuit means for detecting said code violation provides a synchronous frequency signal for reclocking digital audio signals in said digital audio system, and said synchronous frequency signal being a multiple of said preamble repetition frequency signal.

4. An arrangement as claimed in claim 1 wherein said analog circuit means for detecting said code violation further includes a tracking peak detector and a comparator, said integrator providing an analog signal proportional to the duration of said digital signal, and said tracking peak detector providing a reference signal to said comparator, said comparator generating said output signal when said analog signal exceeds said reference signal.

5. An arrangement as claimed in claim 1 wherein said analog circuit means for detecting said code violation includes a polarity detector for determining the polarity of said digital signals, and switching means having at least a first and a second input, said polarity detector providing a signal to said first input of said switching means, said second input of said switching means receiving said digital signals, said switching means providing an unipolar signal representing said digital signal independent of its polarity.

6. An arrangement as claimed in claim 4, wherein said integrator is an automatic gain controlled intergrator.

7. An arrangement for generating a clock for processing serial digital signals representing information in a predetermined code in a digital system receiving said digital signals, wherein said digital information includes data information subdivided in blocks of data including block identifying preamble information, said preamble information including a signal violating said predetermined code, comprising means for generating an unipolar pulse sequence representing said digital signal; and analog circuit means for detecting said code violating signal in said unipolar pulse sequence and outputting a sync-frequency signal, said analog circuit means including an integrator; and a clock generating means for outputting a clock signal, and wherein said sync-frequency signal is used to synchronize the clock signal of said clock generating means.

\* \* \* \* \*